(12) United States Patent
Choi et al.

(10) Patent No.: US 8,420,271 B2
(45) Date of Patent: Apr. 16, 2013

(54) METHOD TO IMPROVE RELIABILITY OF A FUEL CELL SYSTEM USING LOW PERFORMANCE CELL DETECTION AT LOW POWER OPERATION

(75) Inventors: Tayoung Choi, Rochester, NY (US); Sriram Ganapathy, Rochester, NY (US); Jaehak Jung, Pittsford, NY (US); David R. Savage, Webster, NY (US); Balasubramanian Lakshmanan, Pittsford, NY (US); Pamela M. Vecasey, Honeoye Falls, NY (US)

(73) Assignee: GM GLobal Technology Operations LLC, Detroit, MI (US)

( * ) Notice: Subject to any disclaimer, the term of this patent is extended or adjusted under 35 U.S.C. 154(b) by 739 days.

(21) Appl. No.: 12/502,961

(22) Filed: Jul. 14, 2009

(65) Prior Publication Data

US 2011/0014535 A1 Jan. 20, 2011

(51) Int. Cl.
*H01M 8/04* (2006.01)
*H01M 8/24* (2006.01)

(52) U.S. Cl.
USPC ............ 429/432; 429/452; 429/427; 429/428

(58) Field of Classification Search ........................ None
See application file for complete search history.

(56) References Cited

U.S. PATENT DOCUMENTS

2004/0151955 A1* 8/2004 Keskula et al. ................. 429/13
2009/0197155 A1* 8/2009 Ganapathy et al. ............. 429/90

* cited by examiner

*Primary Examiner* — Barbara Gilliam
*Assistant Examiner* — Angela Martin
(74) *Attorney, Agent, or Firm* — John A. Miller; Miller IP Group, PLC

(57) ABSTRACT

A system and method for detecting a low performing cell in a fuel cell stack using measured cell voltages. The method includes determining that the fuel cell stack is running, the stack coolant temperature is above a certain temperature and the stack current density is within a relatively low power range. The method further includes calculating the average cell voltage, and determining whether the difference between the average cell voltage and the minimum cell voltage is greater than a predetermined threshold. If the difference between the average cell voltage and the minimum cell voltage is greater than the predetermined threshold and the minimum cell voltage is less than another predetermined threshold, then the method increments a low performing cell timer. A ratio of the low performing cell timer and a system run timer is calculated to identify a low performing cell.

14 Claims, 2 Drawing Sheets

METHOD TO IMPROVE RELIABILITY OF A FUEL CELL SYSTEM USING LOW PERFORMANCE CELL DETECTION AT LOW POWER OPERATION

GOVERNMENT CONTRACT

The U.S. Government may have a paid-up license in this invention and the right in limited circumstances to require the patent owner to license others on reasonable terms as provided for by the terms of Government Contract/Project awarded by the U.S. Department of Energy.

BACKGROUND OF THE INVENTION

1. Field of the Invention

This invention relates generally to a system and method for detecting a low performing cell in a fuel cell stack and, more particularly, to a system and method for detecting a low performing cell in a fuel cell stack that includes measuring the voltage of the fuel cells in the fuel cell stack at low stack power and determining a ratio of a low performing cell timer to a stack run timer to detect the low performing cell.

2. Discussion of the Related Art

Hydrogen is a very attractive fuel because it is clean and can be used to efficiently produce electricity in a fuel cell. A hydrogen fuel cell is an electrochemical device that includes an anode and a cathode with an electrolyte therebetween. The anode receives hydrogen gas and the cathode receives oxygen or air. The hydrogen gas is dissociated in the anode to generate free protons and electrons. The protons pass through the electrolyte to the cathode. The protons react with the oxygen and the electrons in the cathode to generate water. The electrons from the anode cannot pass through the electrolyte, and thus are directed through a load to perform work before being sent to the cathode.

Proton exchange membrane fuel cells (PEMFC) are a popular fuel cell for vehicles. The PEMFC generally includes a solid polymer electrolyte proton conducting membrane, such as a perfluorosulfonic acid membrane. The anode and cathode typically include finely divided catalytic particles, usually platinum (Pt), supported on carbon particles and mixed with an ionomer. The catalytic mixture is deposited on opposing sides of the membrane. The combination of the anode catalytic mixture, the cathode catalytic mixture and the membrane define a membrane electrode assembly (MEA). MEAs are relatively expensive to manufacture and require certain conditions for effective operation.

Several fuel cells are typically combined in a fuel cell stack to generate the desired power. For example, a typical fuel cell stack for a vehicle may have two hundred or more stacked fuel cells. The fuel cell stack receives a cathode input reactant gas, typically a flow of air forced through the stack by a compressor. Not all of the oxygen is consumed by the stack and some of the air is output as a cathode exhaust gas that may include water as a stack by-product. The fuel cell stack also receives an anode hydrogen reactant gas that flows into the anode side of the stack. The stack also includes flow channels through which a cooling fluid flows.

The fuel cell stack includes a series of bipolar plates positioned between the several MEAs in the stack, where the bipolar plates and the MEAs are positioned between the two end plates. The bipolar plates include an anode side and a cathode side for adjacent fuel cells in the stack. Anode gas flow channels are provided on the anode side of the bipolar plates that allow the anode reactant gas to flow to the respective MEA. Cathode gas flow channels are provided on the cathode side of the bipolar plates that allow the cathode reactant gas to flow to the respective MEA. One end plate includes anode gas flow channels, and the other end plate includes cathode gas flow channels. The bipolar plates and end plates are made of a conductive material, such as stainless steel or a conductive composite. The end plates conduct the electricity generated by the fuel cells out of the stack. The bipolar plates also include flow channels through which a cooling fluid flows.

As a fuel cell stack ages, the performance of the individual cells in the stack degrade differently as a result of various factors. There are different causes of low performing cells, such as cell flooding, loss of catalyst, etc., some temporary and some permanent, some requiring maintenance, and some requiring stack replacement to exchange those low performing cells. Although the fuel cells are electrically coupled in series, the voltage of each cell when a load is coupled across the stack decreases differently where those cells that are low performing have lower voltages. Thus, it is necessary to monitor the cell voltages of the fuel cells in the stack to ensure that the voltages of the cells do not drop below a predetermined threshold voltage to prevent cell voltage polarity reversal, possibly causing permanent damage to the cell.

Current techniques for detecting low performing cells in a fuel cell stack typically estimated cell voltages to detect the low performing cell. Although estimating cell voltage can be fairly accurate, it may be more reliable to provide a technique for determining a low performing cell that actually measures the cell voltages.

SUMMARY OF THE INVENTION

In accordance with the teachings of the present invention, a system and method are disclosed for detecting a low performing cell in a fuel cell stack using measured cell voltages. The system includes a measurement device that is able to identify average cell voltage and minimum cell voltage in the stack. The method includes determining that the fuel cell stack is running, the stack coolant temperature is above a certain temperature and the stack current density is within a relatively low power range. The method further includes calculating the average cell voltage, and determining whether the difference between the average cell voltage and the minimum cell voltage is greater than a predetermined threshold. If the difference between the average cell voltage and the minimum cell voltage is greater than the predetermined threshold and the minimum cell voltage is less than another predetermined threshold, then the method increments a low performing cell timer. A ratio of the low performing cell timer and a system run timer is calculated, and if the ratio is greater than a certain percentage and the run time is greater than a predetermined time, then a low performing cell is detected. This identification decision can be reported to the other algorithm to run certain remedial actions, such as reducing the allowable stack current.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a system and method for detecting a low performing cell in a fuel cell stack using measured cell voltages is merely exemplary in nature, and is in no way intended to limit the invention or its applications or uses.

Figure 1:
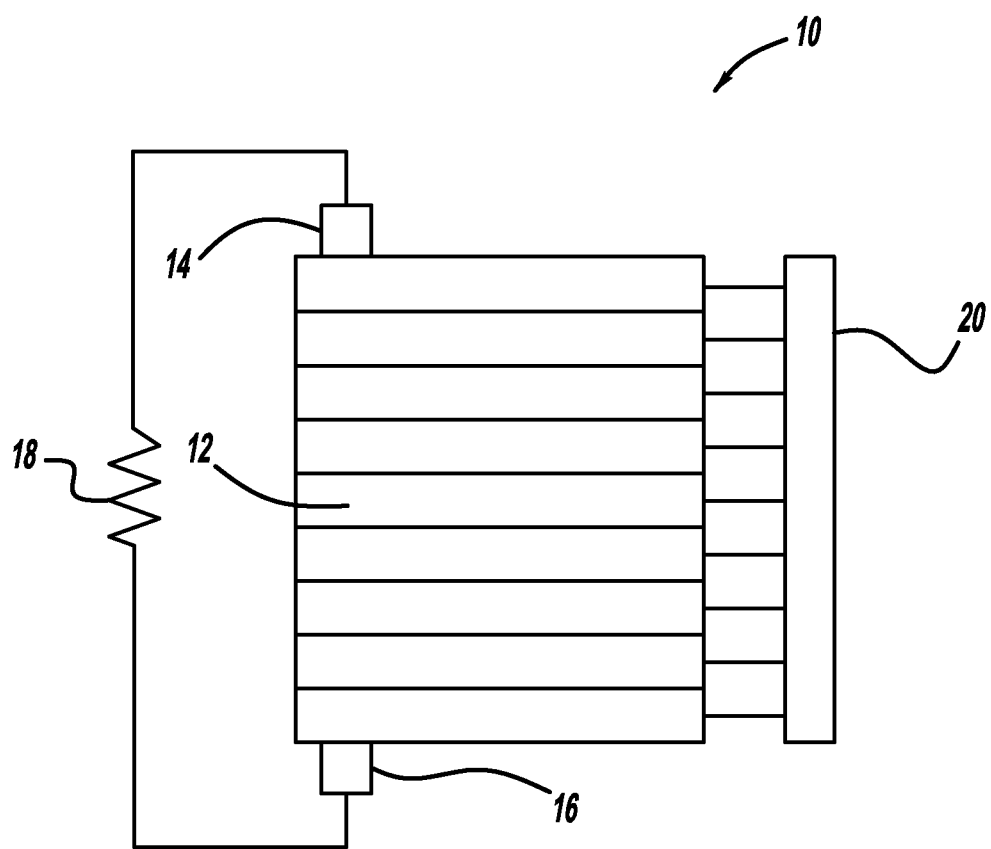
FIG. 1 is a schematic plan view of a fuel cell stack including a low performing cell monitoring circuit.

FIG. 1 is a plan view of a fuel cell stack 10 including a plurality of fuel cells 12 electrically coupled in series. The fuel cell stack 10 also includes a positive terminal 14 and a negative terminal 16 that are electrically coupled to the fuel cells 12. A system load 18 is electrically coupled to the terminals 14 and 16. A voltage monitoring circuit 20 is electrically coupled to the fuel cells 12 and monitors the voltage of each of the fuel cells 12. As will be discussed in detail below, the fuel cell monitoring circuit 20 monitors the voltage of the fuel cells 12 provides an average cell voltage and a minimum cell voltage that can be used by a controller to identify a low performing cell.

As will be discussed below, the present invention includes a system and method for detecting a low performing cell (LPC) in the fuel cell stack 10 that includes using actual measured cell voltages and a ratio of a low performing cell timer $t_{LPC}$ and a system run timer $t_{RUN}$.

Figure 2:
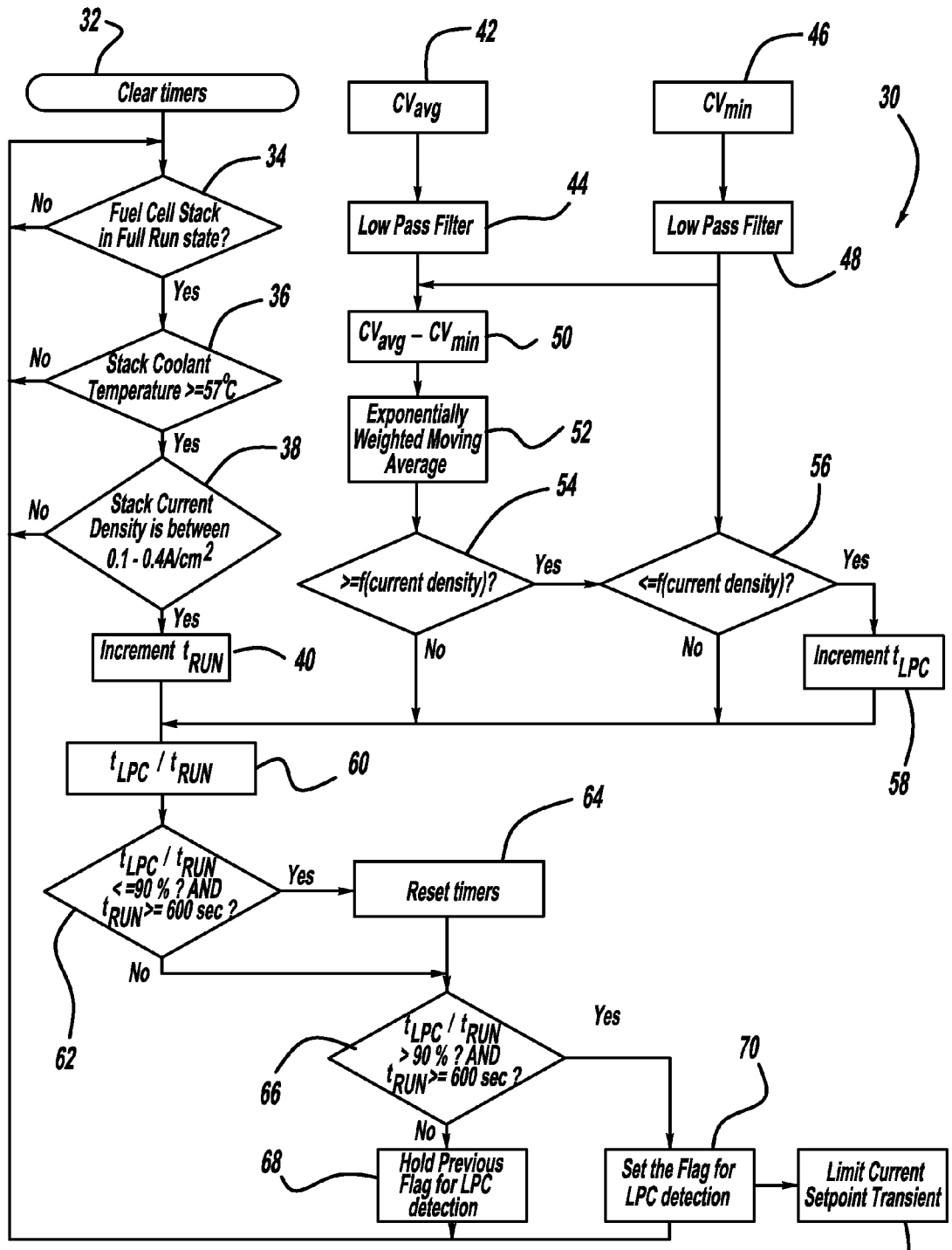
FIG. 2 is a flow chart diagram showing a process for detecting a low performing cell in the fuel cell stack shown in FIG. 1.

FIG. 2 is a flow chart diagram 30 showing a process for the algorithm that detects the low performing cell in this manner. The algorithm first clears the timers $t_{LPC}$ and $t_{RUN}$ at box 32. The algorithm only determines a low performing cell if the fuel cell stack 10 is running, i.e., current is being drawn from the fuel cell stack 10, the stack coolant temperature is above a certain temperature indicating that the stack 10 is able to deliver suitable power and the stack current density is within a low power range, such as 0.1-0.4 A/cm². Thus, at decision diamond 34, the algorithm determines whether the fuel cell stack 10 is running, and if not, returns to the beginning of the process, at decision diamond 36 determines if the stack coolant temperature is above a predetermined value, for example 57° C., and if not, returns to the beginning of the process, and at decision diamond 38 determines whether the stack current density is between 0.1-0.4 A/cm², and if not, returns to the beginning of the process. The reason that the process is limited to a low current density range is to create an early warning indicator and prevent the system from drawing higher current densities if a low performing cell is detected. If all of these conditions are met, the algorithm increments the run timer $t_{RUN}$ at box 40.

Each cell voltage is measured, an average cell voltage $CV_{avg}$ is calculated at box 42 and the calculated average cell voltage $CV_{avg}$ is low pass filtered at box 44. Further, the minimum cell voltage $CV_{min}$ is determined at box 46 and is low pass filtered at box 48. The algorithm then determines the difference between the average cell voltage $CV_{avg}$ and the minimum cell voltage $CV_{min}$ at box 50, and then subjects the voltage difference to an exponentially weighted moving average at box 52. The exponentially weighted moving average removes sharp transients from the calculations as a result of fast changes to the cell voltages during the measurements.

The difference between the average cell voltage $CV_{avg}$ and the minimum cell voltage $CV_{min}$ is then compared to a voltage threshold at decision diamond 54 that is a function of stack current density. Particularly, depending on where in the stack current density range the voltage measurements are currently being taken determines what the voltage threshold will be, where the threshold gets smaller as the stack current density decreases. If the difference between the average cell voltage $CV_{avg}$ and the minimum cell voltage $CV_{min}$ is not greater than the threshold at the decision diamond 54, then the low performing cell timer $t_{LPC}$ is not incremented.

The algorithm determines whether the minimum cell voltage $CV_{min}$ is less than a predetermined voltage threshold at decision diamond 56 that is also a function of the stack current density, and if not, the low performing cell timer $t_{LPC}$ is not incremented. If both the difference between the average cell voltage $CV_{avg}$ and the minimum cell voltage $CV_{min}$ is greater than the voltage threshold at the decision diamond 54 and the minimum cell voltage $CV_{min}$ is less than the voltage threshold at the decision diamond 56, then the low performing cell timer $t_{LPC}$ is incremented at box 58.

The algorithm then calculates a ratio of the low performing cell timer $t_{LPC}$ to the run timer $t_{RUN}$ at box 60, and then determines whether the ratio $t_{LPC}/t_{RUN}$ is less than or equal to some predetermined ratio, for example, 90%, and whether the run timer $t_{RUN}$ is greater than some predetermined time, for example, 600 second, at decision diamond 62. If the ratio $t_{LPC}/t_{RUN}$ is less than 90% and the run timer $t_{RUN}$ is greater than 600 seconds at the decision diamond 62, then there is not a low performing cell and the run time has exceeded its maximum run time value for the process. Thus, the timers $t_{RUN}$ and $t_{LPC}$ are reset at box 64. The maximum run time is provided because it is unknown how long the stack 10 will actually be running.

If the ratio of $t_{LPC}/t_{RUN}$ is greater than 90% or the run timer $t_{RUN}$ is less than 600 second at the decision diamond 62, then the algorithm determines whether the ratio $t_{LPC}/t_{RUN}$ is greater than 90% and the run timer $t_{RUN}$ is greater than or equal to, for example, 60 seconds at decision diamond 66. A run time of 60 seconds is selected as an arbitrary time to eliminate the instability that may occur at stack start-up so that a detection of a low performing cell will not occur until the fuel cell stack 10 is more stably operating.

If the ratio $t_{LPC}/t_{RUN}$ is not greater than 90% or the run timer $t_{RUN}$ is not greater than 60 seconds at the decision diamond 66, then a lower performing cell is not detected at box 68, and the algorithm returns to the beginning. If, however, the ratio $t_{LPC}/t_{RUN}$ is greater than 90% and the run timer $t_{RUN}$ is greater than 60 seconds at the decision diamond 66, then a low performing cell is detected at box 70 and an appropriate flag is set. The algorithm can then take certain remedial actions at box 72, such as limit current set point transients, which eventually limits allowable current draw from the fuel cell stack 10.

The ratio $t_{LPC}/t_{RUN}$ is able to give an indication of a low performing cell because the timer $t_{LPC}$ is incremented the longer the minimum cell voltage $CV_{min}$ is below some predetermined threshold over the same run time period. In other words, as the fuel cell stack 10 is being run and the minimum cell voltage $CV_{min}$ is maintained below the threshold, then the ratio $t_{LPC}/t_{RUN}$ will be close to 100%.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for detecting a low performing cell in a fuel cell stack, said method comprising:
   measuring the voltage of each fuel cell in the fuel cell stack;
   determining the minimum cell voltage of the measured voltages;
   calculating an average cell voltage from the measured voltages;

determining a difference between the calculated average cell voltage and the minimum cell voltage;

determining whether the difference exceeds a first predetermined voltage threshold;

determining whether the minimum cell voltage is less than a second predetermined voltage threshold;

incrementing a low performing cell timer if both the difference exceeds the first predetermined voltage threshold and the minimum cell voltage is less than the second predetermined voltage threshold;

calculating a ratio between the low performing cell timer and a system run timer; and determining if the ratio exceeds a predetermined percentage to determine whether the fuel cell stack includes a low performing cell.

2. The method according to claim 1 further comprising also determining whether the run timer has exceeded a predetermined run time to determine whether there is a low performing cell in the fuel cell stack.

3. The method according to claim 2 wherein the predetermined run time is 60 seconds.

4. The method according to claim 1 wherein the predetermined percentage is 90%.

5. The method according to claim 1 wherein the first and second voltage thresholds are a function of stack current density where the first and second voltage thresholds change depending on the stack current density.

6. The method according to claim 1 further comprising incrementing the run timer at predetermined intervals and resetting the low performing cell timer and the run timer when the run timer reaches a maximum run time.

7. The method according to claim 6 wherein the maximum run time is 600 seconds.

8. The method according to claim 1 further comprising only detecting a low performing cell if the fuel cell stack is in a run state and a stack coolant temperature is above a predetermined temperature.

9. The method according to claim 1 further comprising only detecting the low performing cell if the stack current density is between 0.1 and 0.4 A/cm$^2$.

10. A system for detecting a low performing cell in a fuel cell stack, said system comprising:

means for measuring the voltage of each fuel cell in the fuel cell stack;

means for determining the minimum cell voltage of the measured voltages;

means for calculating an average cell voltage from the measured voltages;

means for determining a difference between the calculated average cell voltage and the minimum cell voltage;

means for determining whether the difference exceeds a first predetermined voltage threshold;

means for determining whether the minimum cell voltage is less than a second predetermined voltage threshold;

means for incrementing a low performing cell timer if both the difference exceeds the first predetermined voltage threshold and the minimum cell voltage is less than the second predetermined voltage threshold;

means for calculating a ratio between the low performing cell timer and a system run timer; and means for determining if the ratio exceeds a predetermined percentage to determine whether the fuel cell stack includes a low performing cell.

11. The system according to claim 10 further comprising means for determining whether the run timer has exceeded a predetermined time to determine whether there is a low performing cell in the fuel cell stack.

12. The system according to claim 10 wherein the first and second voltage thresholds are a function of stack current density where the first and second voltage thresholds change depending on the stack current density.

13. The system according to claim 10 further comprising means for incrementing the run timer at predetermined intervals and resetting the low performing cell timer and the run timer when the run timer reaches a maximum run time.

14. The system according to claim 10 wherein the system only detects a low performing cell if the fuel cell stack is in a run state, a stack coolant temperature is above a predetermined temperature and the stack current density is in a low stack current density range.

* * * * *